United States Patent
Muller

(10) Patent No.: US 7,197,804 B2
(45) Date of Patent: Apr. 3, 2007

(54) METHOD OF MAKING COPPER AND CARBON NANOTUBE THERMAL CONDUCTOR

(75) Inventor: Heinrich G. Muller, Rancho Palos Verdes, CA (US)

(73) Assignee: The Aerospace Corporation, El Segundo, CA (US)

( * ) Notice: Subject to any disclaimer, the term of this patent is extended or adjusted under 35 U.S.C. 154(b) by 33 days.

(21) Appl. No.: 11/214,204

(22) Filed: Aug. 29, 2005

(65) Prior Publication Data

US 2007/0050870 A1    Mar. 1, 2007

(51) Int. Cl.
*B23P 17/04*    (2006.01)
(52) U.S. Cl. .................... 29/419.1; 977/784
(58) Field of Classification Search ............... 165/185; 29/419.1; 977/784
See application file for complete search history.

(56) References Cited

U.S. PATENT DOCUMENTS

| | | | |
|---|---|---|---|
| 6,652,958 B2 * | 11/2003 | Tobita | 428/298.1 |
| 6,856,016 B2 * | 2/2005 | Searls et al. | 257/720 |
| 6,864,571 B2 * | 3/2005 | Arik et al. | 257/712 |
| 2004/0152240 A1 * | 8/2004 | Dangelo | 438/122 |
| 2005/0116336 A1 * | 6/2005 | Chopra et al. | 257/720 |
| 2005/0224220 A1 * | 10/2005 | Li et al. | 165/185 |
| 2006/0011336 A1 * | 1/2006 | Frul | 165/185 |

* cited by examiner

*Primary Examiner*—Evan Pert
(74) *Attorney, Agent, or Firm*—Derrick Michael Reid

(57) ABSTRACT

A thermal conductor is made of copper and carbon nanotubes powders that are compressed together and then cold rolled into sheets for aligning the carbon nanotubes for providing a composite matrix having a low coefficient of thermal expansion, high thermal conductivity, and high electrical conductivity, for preferred use as a conducting heat sink, such as a laser submount, for heat sinking dissipation and electrical grounding of high-power electrical components and circuits, such as a laser diode.

8 Claims, 1 Drawing Sheet

THERMAL CONDUCTOR MANUFACTURING METHOD

COPPER AND CARBON NANOTUBE THERMAL CONDUCTOR

THERMAL CONDUCTOR MANUFACTURING METHOD

METHOD OF MAKING COPPER AND CARBON NANOTUBE THERMAL CONDUCTOR

STATEMENT OF GOVERNMENT INTEREST

The invention was made with Government support under contract No. F04701-00-C-0009 by the Department of the Air Force. The Government has certain rights in the invention.

FIELD OF THE INVENTION

The invention relates to the field of thermal conductors. More particularly, the present invention relates to thermal conductors made of copper and carbon nanotubes having a low coefficient of thermal expansion, high thermal conductivity, and high electrical conductivity.

BACKGROUND OF THE INVENTION

A material for cooling electronic and photonic systems with high power density is desirable. High power systems tend to generate heat in very localized areas, causing the devices used in such systems to overheat. Diode lasers and all highly integrated electronics require efficient cooling. The key to efficient cooling is to bring the thermal conductor in the closest possible proximity to the devices and create a good thermal contact. Typically, the semiconducting devices are soldered directly onto the thermal conductor. However, the best thermal conductors disadvantageously tend to have a much higher coefficient of thermal expansion than semiconductor devices. Thermal conductors made of diamond tend to have a lower coefficient of thermal expansion than semiconductors. Mechanical stresses are induced during temperature cycling that will tend to overstress the semiconductor devices leading to potential failures when only copper or only diamond is used as a heat sink for semiconductor devices.

The extraordinary mechanical, thermal, and electronic properties of carbon nanotubes have attracted widespread interest. The carbon nanotubes exhibit a very low coefficient of thermal expansion, high strength, high elastic modulus, and uniquely high thermal conductivity along their longitudinal axis, but exhibit only average properties orthogonal to longitudinal axis, similar to those of graphite. Carbon nanotubes have a very low thermal expansion coefficient on the order of the coefficient of thermal expansion of diamond. Carbon nanotubes have been incorporated into polymeric materials and stretched to enhance thermal and electrical conductivity and to reduce the coefficient of thermal expansion of the polymers. However, polymers are unsuitable for use as thermal conductors and grounding heat sinks for semiconductor devices. Common carbon materials, such as graphite, exhibit poor thermal and electrical conductivity unsuitable for use as thermal conductors for semiconductor devices.

A substrate material for diode lasers, for example, can be a thermal conductor with a required coefficient of thermal expansion between 3.0 and 8.0 ppm/K. The exact value of this coefficient of thermal expansion depends upon which material the diode laser is made of. Carbon nanotubes have a coefficient of thermal expansion of about 0 ppm/° C. with thermal conductivity of K equal to 1000 W/mK to 1500 W/mK. Copper has a thermal conductivity of K=400 W/mK. Copper, however, expands at a rate of 16.6 ppm/K and produces significant stresses and subsequent device deterioration when soldered directly onto the device. Alternatively, diamond heat sinks have been used. Diamond heat sinks have a coefficient of thermal expansion of about 1.3 ppm/K, which is too small to fit with semiconductor devices. A bonding adhesion of any material for diamond also presents another significant problem when using diamond heat sinks. To solve the problem of heat sinking in diode laser systems, copper is used for the heat sink material as an alloy with tungsten. Forming such an alloy adjusts the coefficient of thermal expansion to about 8 ppm/K, but undesirably cuts the thermal conductivity of copper in half, from 400 W/mK to 200 W/mK. These and other disadvantages are solved or reduced using the invention.

SUMMARY OF THE INVENTION

An object of the invention is to provide a thermal conductor having a predetermined coefficient of thermal expansion.

Another object of the invention is to provide a thermal conductor having a predetermined coefficient of thermal expansion, having high electrical conductivity, and having high thermal conductivity.

Yet another object of the invention is to provide a thermal conductor made of compressed copper and carbon nanotubes and having a predetermined coefficient of thermal expansion, having high electrical conductivity, and having high thermal conductivity.

Still another object of the invention is to provide a thermal conductor made of compressed and rolled copper and carbon nanotubes and having a predetermined coefficient of thermal expansion, having high electrical conductivity, and having high thermal conductivity.

A further object of the invention is to provide a thermal conductor made of compressed and rolled copper and carbon nanotubes and having a predetermined coefficient of thermal expansion, having high electrical conductivity and having high thermal conductivity in the plane that the copper has been rolled along the length of the carbon nanotubes dispersed within the copper, which carbon nanotubes have been aligned in the plane by the rolling action.

The invention is directed to a thermal conductor made of copper and carbon nanotubes. The thermal conductor is made by a preferred method of manufacture. The combination of the copper and carbon nanotubes in predetermined proportions provides for a predetermined coefficient of thermal expansion, thermal conductivity, and electrical conductivity for preferred use as grounding heat sinks for semiconductor devices, such as a submount for a laser diode. The thermal conductor has an increased thermal conductivity and simultaneously a reduced and adjustable coefficient of thermal expansion by mixing carbon nanotubes and copper. This adjustable coefficient of thermal expansion creates a desirable material for thermal conduction use. The predetermined thermal and electrical properties are set as needed for heat sinking high power semiconductor devices. By mixing the carbon nanotubes with copper, the coefficient of thermal expansion of the mixture will be reduced, and simultaneously the thermal conductivity will be increased. With a percentage of about 25% carbon nanotubes, the thermal conductor provides a desirable coefficient of thermal expansion of 5 ppm/° C., while simultaneously almost doubling the thermal conductivity of copper from 400 W/mK to 750 W/mK.

The actual mixing of the copper and carbon nanotube components can be performed at low temperatures, employing conventional compression processes for preparation of copper sheets of any kind. The use of a low temperature mixing and compression process prevents the carbon nanotubes from being destroyed by oxidation. Subsequent cold rolling of the thermal conductor orients the carbon nanotubes into a desirable orientation in the plane of the rolled sheet of thermal conductor material. The orientation brings the thermal expansion coefficient of the thermal conductor to predetermined values that match with the semiconductor devices to reduce stresses during temperature cycling. These and other advantages will become more apparent from the following detailed description of the preferred embodiment.

Figure 1:
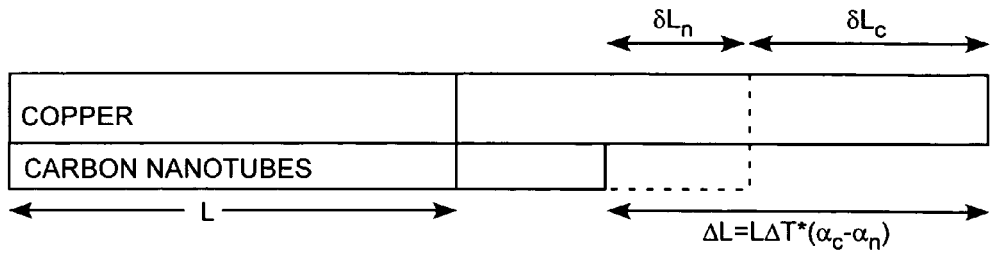
FIG. 1 depicts a thermal conductor.
Figure 2:
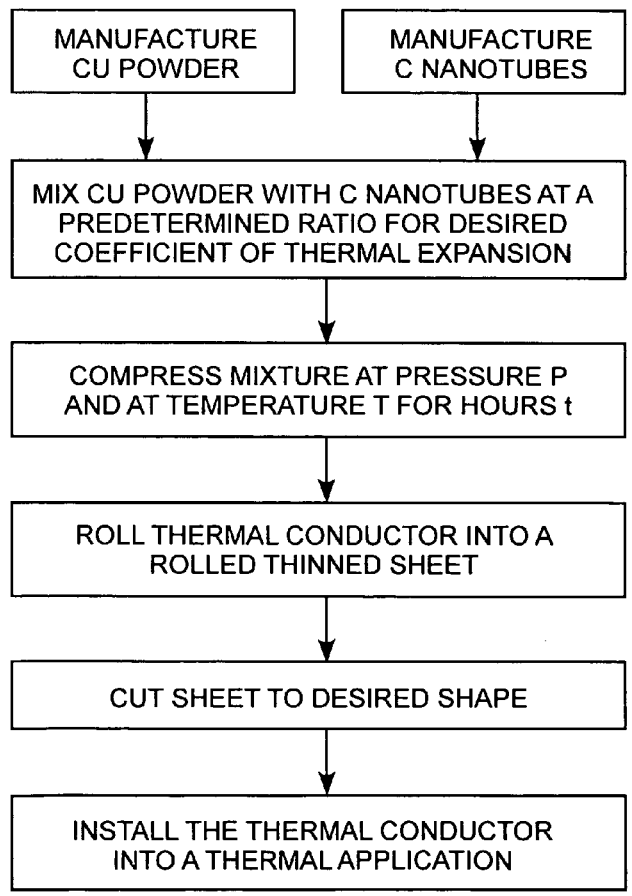
FIG. 2 is a process flow for making a thermal conductor made of copper and carbon nanotubes.

DETAILED DESCRIPTION OF THE
PREFERRED EMBODIMENT

An embodiment of the invention is described with reference to the figures using reference designations as shown in the figures. Referring to Figures, the thermal conductor can be used as metallic submounts for electronic high power devices, such as semiconductor diode lasers, with the thermal conductor having a coefficient of thermal expansion equaling the semiconductors to which the thermal conductor is applied. When the nanotubes are oriented in the matrix of copper by cold rolling, composite material can be modeled as a linear block that has a fraction of the cross section made out of carbon nanotubes with the remaining fraction made out of copper. When the composite material matrix undergoes a temperature change, the copper portion will try to expand at a much higher rate than the carbon portion. As both components are mixed across the cross section of the conductor, the carbon nanotubes will exert an elastic stress $\sigma_n$ on the copper, and the copper will develop an opposing elastic stress $\sigma_c$. The forces created by these elastic stresses will have to balance, resulting in an expansion lower than that of copper and higher than that of the carbon nanotubes.

To quantify the properties of the thermal conductor, the two components, copper and carbon nanotubes, are independently extended by a temperature change $\Delta T$, over a length L. The length of the two components would differ by some distance $\Delta L$ that can be expressed as $\Delta L=L*\Delta T*(\alpha_c-\alpha_n)$, where $\alpha_c$ and $\alpha_n$ are the thermal expansion coefficients for copper and nanotubes, respectively. When the copper and carbon nanotube components are part of the same matrix, this difference would be compensated by an elastic expansion of the nanotubes $\delta L_n$ combined with an elastic contraction of the copper $\delta L_c$. The two elastic deformations add up to compensate for the length difference so that $\Delta L=\delta L_n+\delta L_c$. The two elastic deformations can be calculated from Young's modulus E for the materials, and the relative percentages of the cross section that the components occupy. The elastic deformation of the nanotubes is $\delta L_n=F*L/(S*A*E_n)$ and the elastic deformation of the copper is $\delta L_c=F*L/(S*(1-A)*E_c)$. The term S is the total cross section of the sample and the term A is the percentage of the cross section that consists of the carbon nanotubes.

The ratio of the quantities $\delta L_n/\delta L_c=(1-A)/A*E_c/E_n$ where the force F cancels out because the force has to be the same on both components. As such, $\delta L_c=L*\Delta T*(\alpha_c-\alpha_n)/(1+(1-A)/A*E_c/E_n)$ that describes the change in the thermal expansion coefficient of the matrix due to the mixing of copper with the carbon nanotubes. By varying the percentage of carbon nanotubes in the mixture, there is a change in the thermal expansion from that of carbon nanotubes to that of copper. For the case where the term A approaches zero, $\delta L_c$ diminishes to zero, and the correction disappears. Exemplar data can be used, such as, $\alpha_c=16.6$ ppm/° C., $\alpha_n=1.0$ ppm/° C., $E_c=1.2*10^{11}$ Pa and $E_n=1*10^{12}$ Pa. A fraction of 25% percent by volume of carbon nanotubes will result in a combined coefficient of thermal expansion of 5 ppm/° C. The resulting thermal conductivity will be 747 W/mK when using thermal conductivity values of 1800 W/mK for the thermal conductivity of carbon nanotubes and when using 400 W/mK for pure copper. The ratio by percent volume of the carbon nanotubes to copper in the thermal conductor is preferably between 10% and 50%.

Carbon nanotubes are now commercially available through a variety of vendors. The carbon nanotubes are sensitive to high temperatures, such as above about 600° C., when the carbon nanotubes tend to oxidize when the carbon nanotubes are in contact with oxygen. Mixing carbon nanotubes with liquid copper would require melting the copper. As copper has a melting point of 1063° C., the melting temperature would result in the destruction of the carbon nanotubes. To circumvent thermal destruction of the carbon nanotubes during manufacture, copper is first mixed with the carbon nanotubes in a form of a fine-grained powder. This mixture is then pressed together at about 300° C. and 30,000 psi for 4 hours to form a plate of the copper and carbon nanotube mixture. A standard process for forming copper sheets and plates consists of cold rolling. Cold rolling is a process that uses the plasticity of copper at room temperature to flatten prefabricated thicker sheets into thinner sheets. The cold rolling will orient the carbon nanotubes in the plane of the sheet, facilitating the best thermal conductivity in that plane. After the cold rolling, a customary low temperature annealing process can be used to recrystallize the copper and fortify the structure into a single plate. The plate can then be cut into the desired size of the thermal conductor.

The thermal conductor has many applications. As a submount for diode lasers, the thermal conductor has a coefficient of thermal expansion of about 5 ppm/° C., which is precisely that of the laser diode semiconductor with K>400 W/mK. The mixture of copper and carbon nanotubes is characterized as increasing the thermal conductivity over copper and decreasing the coefficient of thermal expansion below the value of copper. The coefficient of thermal expansion, thermal conductivity, and electrical conductivity can be predetermined. The thermal conductor can be installed in various applications with respective predetermined and required coefficient of thermal expansion, thermal conductivity, and electrical conductivity that can be predetermined. Various pressures, temperatures, and mixture ratios can be used to form the thermal conductor having respectively differing coefficient of thermal expansions, thermal conductivities, and electrical conductivities. Those skilled in the art can make enhancements, improvements, and modifications to the invention, and these enhancements, improvements, and modifications may nonetheless fall within the spirit and scope of the following claims.

What is claimed is:

1. A method of manufacturing thermal conductor sheet, the method comprising the steps of,
    mixing copper and carbon fibers together in a mixture at a predetermined ratio, and
    rolling the mixture to flatten the thermal conductor into a sheet with the carbon nanotubes being aligned within the plane of the sheet of the thermal conductor.

2. The method of claim 1 further comprising the step of, compressing the copper and carbon nanotubes after the mixing step.

3. The method of claim 1 further comprising the step of, compressing the copper and carbon nanotubes after the mixing step at a predetermined temperature.

4. The method of claim 1 further comprising the step of, compressing the copper and carbon nanotubes after the mixing step at a predetermined pressure and temperature.

5. The method of claim 1 wherein,
the thermal conductor has a coefficient of thermal expansion less than that of the copper and more than that of carbon nanotubes.

6. The method of claim 1 wherein,
the thermal conductor has a thermal conductivity higher than that of the copper.

7. The method of claim 1 wherein,
the mixture is 25% carbon nanotubes.

8. The method of claim 1 wherein,
the mixture is between 10% to 50% nanotubes.

* * * * *